United States Patent
Sim

(10) Patent No.: US 7,977,726 B2
(45) Date of Patent: Jul. 12, 2011

(54) DRAM CELL WITH ENHANCED CAPACITOR AREA AND THE METHOD OF MANUFACTURING THE SAME

(75) Inventor: Jai-Hoon Sim, Hsinchu-Hsien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 582 days.

(21) Appl. No.: 11/896,418

(22) Filed: Aug. 31, 2007

(65) Prior Publication Data

US 2009/0057741 A1 Mar. 5, 2009

(51) Int. Cl.
*H01L 27/108* (2006.01)

(52) U.S. Cl. .......................... 257/309; 257/306; 257/296

(58) Field of Classification Search .................. 257/296, 257/306, 309

See application file for complete search history.

(56) References Cited

U.S. PATENT DOCUMENTS

| | | | |
|---|---|---|---|
| 4,864,464 A | 9/1989 | Gonzalez | |
| 6,569,717 B1 * | 5/2003 | Murade | 438/149 |
| 6,847,076 B1 | 1/2005 | Tsou | |

FOREIGN PATENT DOCUMENTS

JP 1027884 1/1998

* cited by examiner

*Primary Examiner* — Douglas M Menz
(74) *Attorney, Agent, or Firm* — Muncy, Geissler, Olds & Lowe, PLLC

(57) ABSTRACT

A dynamic random access memory (DRAM) cell and the method of manufacturing the same are provided. The DRAM cell includes a cell transistor and a cell capacitor. The cell capacitor includes a first, second and third dielectric layer, and a first, second and third capacitor electrode. The first dielectric layer is located on a first capacitor electrode. The second capacitor electrode is located on top of the first dielectric layer. The second dielectric layer is located on the second capacitor electrode. The third capacitor electrode is located on the second dielectric layer and is electrically connected with the drain. The third dielectric layer is located between the third capacitor electrode and the gate for isolating the gate from the third capacitor electrode.

17 Claims, 5 Drawing Sheets

DRAM CELL WITH ENHANCED CAPACITOR AREA AND THE METHOD OF MANUFACTURING THE SAME

BACKGROUND

1. Field of Invention

The present invention relates to a DRAM cell. More particularly, the present invention relates to a DRAM cell with enhanced capacitor area.

2. Description of Related Art

Dynamic random access memories (DRAM) cell, such as Embedded DRAM (eDRAM) cell, includes mainly a metal oxide semiconductor field effective transistor (MOSFET), and a capacitor cell. In a conventional planar type eDRAM cell, the gate dielectric layer and gate poly layer are used as a cell capacitor structure to store the signal in the inversion charge below the capacitor dielectric. Please refer to FIG. 1, a convention planar type eDRAM cell. A dielectric layer 102 such as a silicon oxide layer is formed on a silicon substrate 104. A poly layer 106 is formed on top of the dielectric layer 102 to form a capacitance between the poly layer 106 and the inversion charge region 108 in the substrate 104. The dielectric layer 102 and the poly layer 106 are patterned to form a gate structure 110 and a cell capacitor structure 112. The cell capacitor 112 provides a capacitance value proportional to the interface area between the inversion charge region 108 and the poly layer 106.

In recent years, as the cell size shrinks to keep up with the current technology evolvement, the interface area also shrinks dramatically. From the DRAM design point of view, lowering the capacitance value in a DRAM cell is undesirable, yet the physical limitations cannot be avoided with the current capacitor structure. The conventional planar type eDRAM cells suffer from low cell capacitance area due to non-scalable gate oxide thickness of the cell transistor and cell capacitor. Therefore, the cell size could not be scaled down below the N90 generation and thus expensive MiM based eDRAM needed to be used.

Various attempts to increase the capacitance of a eDRAM cell while maintaining the cell size involves further complications to the cell structure and thus suffers in integration with the current manufacturing process of an eDRAM cell. For example, U.S. Pat. No. 4,864,464 disclosed a DRAM cell capacitor with an additional dielectric layer and poly layer to form extra capacitance on top of the pre-existing dielectric layer a poly layer. However, in this case, an additional third poly layer is dedicated to make the connection between storage nodes. Also, the prior art design is not compatible with salicide process, thus requires a dedicated DRAM cell process in order to achieve the projected performance.

For the forgoing reasons, there is a need for a new DRAM cell structure and manufacturing method with higher capacitor values while having a small cell size.

SUMMARY

The present invention is directed to a DRAM cell, that it satisfies this need of increasing the capacitance of a cell capacitor without increasing the size of the DRAM cell. The DRAM cell includes a cell transistor and a cell capacitor. The cell capacitor includes a first, second and third dielectric layer, and a first, second and third capacitor electrode. The first dielectric layer is located on a first capacitor electrode. The second capacitor electrode is located on top of the first dielectric layer. The second dielectric layer is located on the second capacitor electrode. The third capacitor electrode is located on the second dielectric layer and is electrically connected with the drain. The third dielectric layer is located between the third capacitor electrode and the gate for isolating the gate from the third capacitor electrode.

In the above embodiment of the present invention, the third capacitor electrode and the second dielectric layer introduces an additional capacitance between the second capacitor electrode and the third capacitor electrode. The additional capacitance formed parallel to the original capacitance between the first capacitor electrode and the second capacitor electrode provides a total DRAM cell capacitance, which is two to three times the original capacitance.

Furthermore, the third capacitor electrode and the second dielectric layer can be formed in a conventional DRAM cell self-alignment process. Thus, no dedicated process is required to form the extra capacitance, rather, only an additional lithography process forming a second capacitance structure (third capacitor electrode and second dielectric layer) to achieve higher capacitance for the DRAM cell is needed, thus eliminating compatibility issues.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
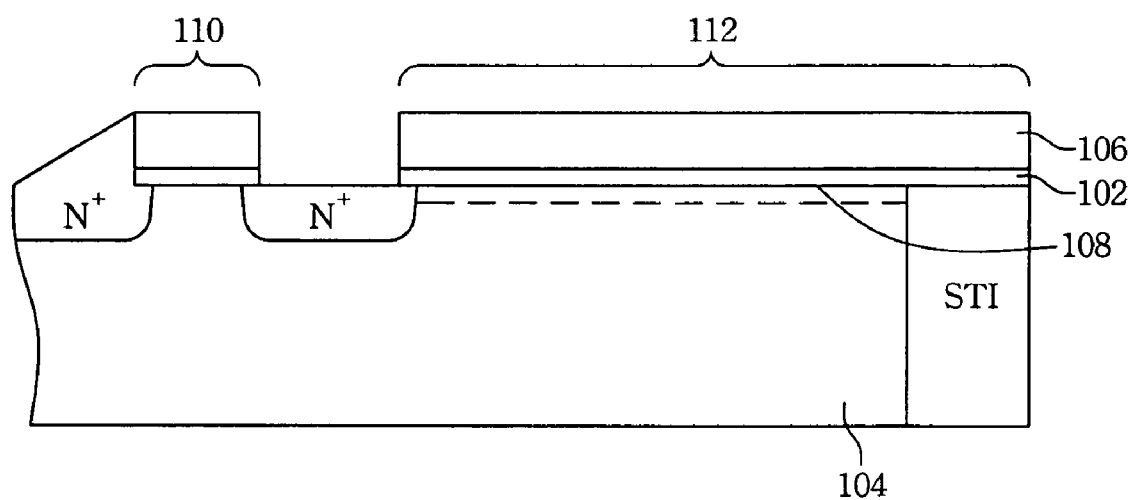
FIG. 1 is a convention planar type eDRAM cell.

Reference will now be made in detail to the present preferred embodiments of the invention, examples of which are illustrated in the accompanying drawings. Wherever possible, the same reference numbers are used in the drawings and the description to refer to the same or like parts.

Figure 2:
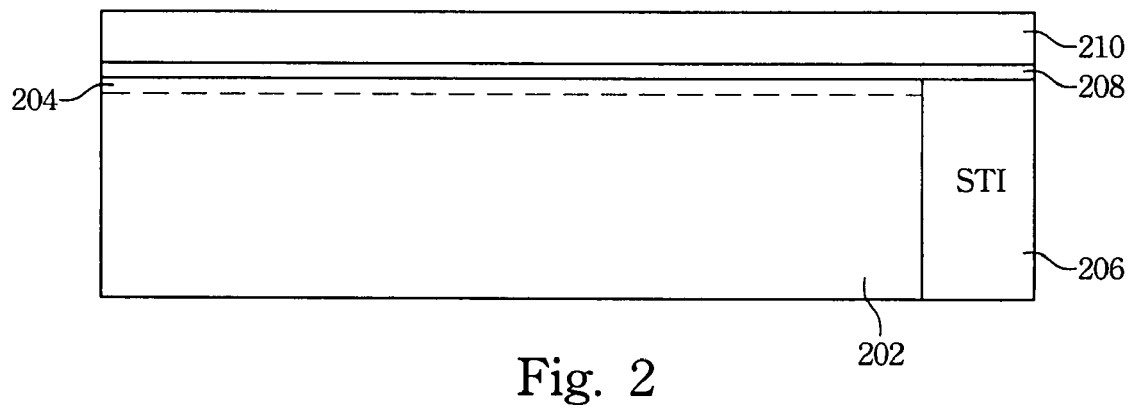
FIG. 2 is a cross section view of a DRAM cell at a first step of manufacturing according to one preferred embodiment of this invention.

Please refer to FIG. 2, a cross section view of a DRAM cell at a first step of manufacturing. A semiconductor substrate 202 is provided with a first capacitor electrode 204 formed beside an isolation structure 206 such as a shallow trench isolation (STI) structure. The first capacitor electrode 204 may be an inversion charge region on the substrate 202. The STI is used to isolate the DRAM cell from other DRAM cells. In this step, a first dielectric layer 208 and a first conductive layer 210 are formed sequentially on top of the substrate 202. The first dielectric layer 208 can be any material used to form a gate oxide for a cell transistor. The first conductive layer 210 may be a polysilicon layer.

Figure 3A:
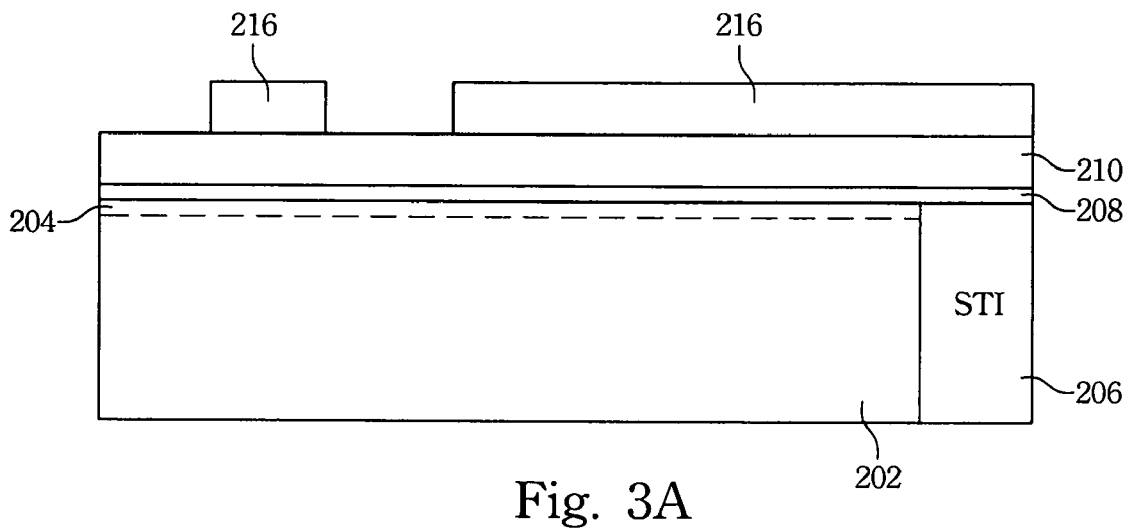
FIGS. 3A and 3B are cross section views of a DRAM cell at a second step of manufacturing according to one preferred embodiment of this invention.
Figure 3B:
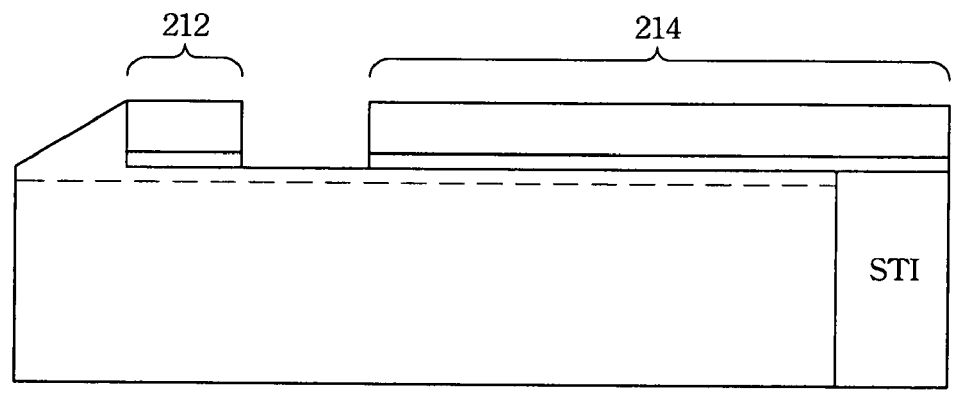

Next, please refer to FIGS. 3A and 3B, a cross section view of a DRAM cell at a second step of manufacturing. The second step of manufacturing is to pattern the first dielectric layer 208 and the first conductive layer 210 to form a gate structure 212 and a first capacitor structure 214. Patterning may be performed by a lithography process. First, in FIG. 3A, a first photo-resist layer 216 patterned by a first mask is applied on top of the first conductive layer 210. The first conductive layer 210 and the first dielectric layer 208 are then etched as in FIG. 3B to form the gate structure 212 and the first capacitor structure 214. The etched first conductive layer 210 may become a second capacitor electrode of the first capacitor structure 214, where the first capacitor structure may have a capacitance of X. The value of the capacitance X is proportional to the overlapping area in the vertical direction between the first capacitor electrode 204 and the first conductive layers 210, which is a second capacitor electrode.

Figure 4:
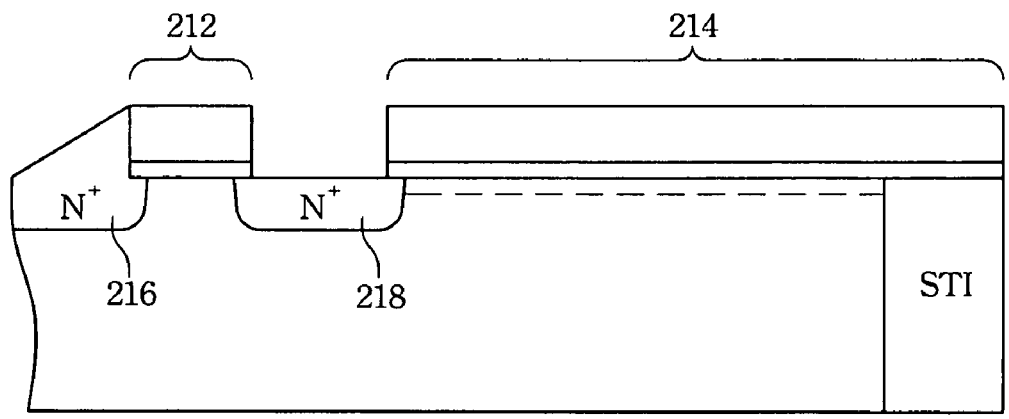
FIG. 4 is a cross section view of a DRAM cell at a third step of manufacturing according to one preferred embodiment of this invention.

Please refer to FIG. 4, a cross section view of a DRAM cell at a third step of manufacturing. The step after forming the gate structure 212 and the first capacitor structure 214 is to form the source 216 and the drain 218 laterally adjacent to the gate structure 212 to provide a cell transistor for the DRAM cell 200. The source 216 and drain 218 may be formed by first implanting ions to form a cell lightly-doped drain (CLDD) after the second step and drive in N+ or P+ ions to complete the source/drain formation at a stage of the manufacturing process.

Figure 5:
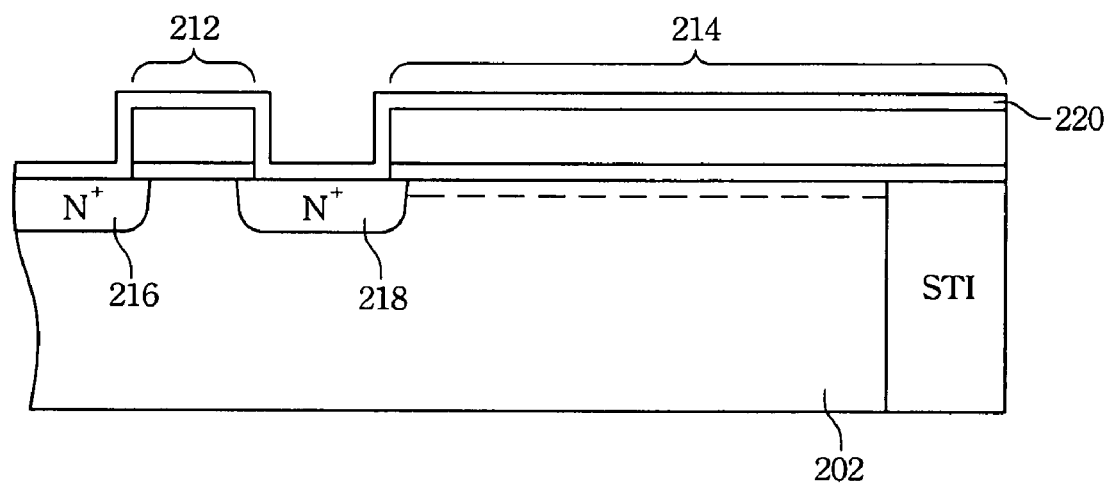
FIG. 5 is a cross section view of a DRAM cell at a fourth step of manufacturing according to one preferred embodiment of this invention.

Next, please refer to FIG. 5, a cross section view of a DRAM cell at a fourth step of manufacturing. In this step, a second dielectric layer 220 is formed over the gate structure 212, the first capacitor structure 214 and the substrate 202. The second dielectric layer 220 may have a thickness different than the first dielectric layer, but it does not have the limitations of a gate oxide layer. The second dielectric layer 220 may be a silicon oxide layer, a silicon nitride layer, an aluminum oxide layer, or a zirconium oxide layer. Different dielectric materials possess different permittivities, and the capacitance of a capacitor is directly proportional to the permittivity of the capacitor dielectric material. For example, the permittivity of silicon oxide (gate oxide) is about 3.9 and the permittivity of silicon nitride is about 7.9, which almost doubles the permittivity of silicon oxide. The advantage with the ability to select the dielectric material with desired permittivity as the second dielectric layer is to be able to increase the capacitance formed between the second capacitor electrode and the third capacitor electrode as further explained later.

Figure 6A:
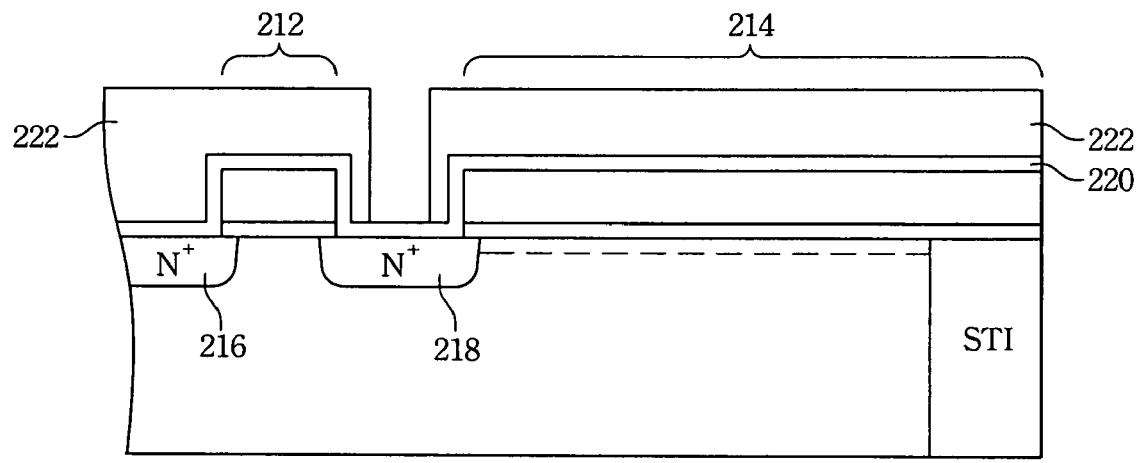
FIGS. 6A and 6B are cross section views of a DRAM cell at a fifth step of manufacturing according to one preferred embodiment of this invention.
Figure 6B:
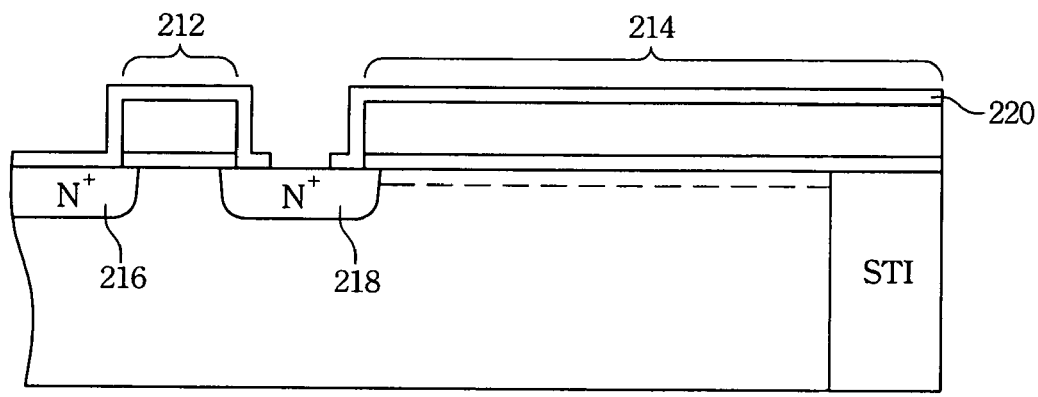

Please refer to FIGS. 6A and 6B, a cross section view of a DRAM cell at a fifth step of manufacturing. In this step, a portion of the drain region 218 is exposed between the gate structure 212 and the first capacitor structure 214 for electrical connection. First, a second photo-resist layer 222 is applied to the top of the DRAM cell 200 and patterned by a second mask as in FIG. 6A. Next, the second dielectric layer 220 is etched to expose the drain region 218 and then the second photo-resist layer 222 is removed as shown in FIG. 6B.

Figure 7:
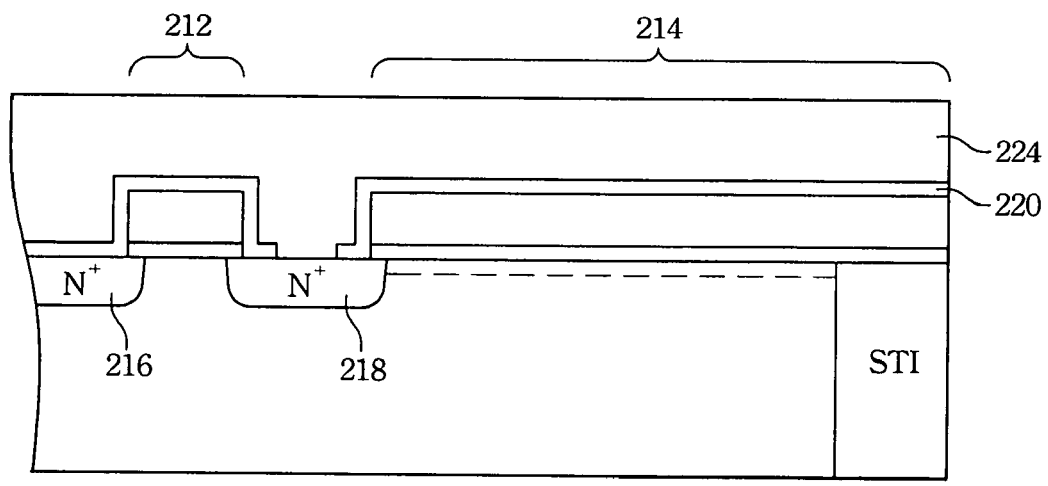
FIG. 7 is a cross section view of a DRAM cell at a sixth step of manufacturing according to one preferred embodiment of this invention.

Next, please refer to FIG. 7, a cross section view of a DRAM cell at a sixth step of manufacturing. In this step, a second conductive layer 224 is formed over the second dielectric layer 220 and the exposed portion of the drain region 218. The second conductive layer 224 may be a polysilicon layer.

Figure 8A:
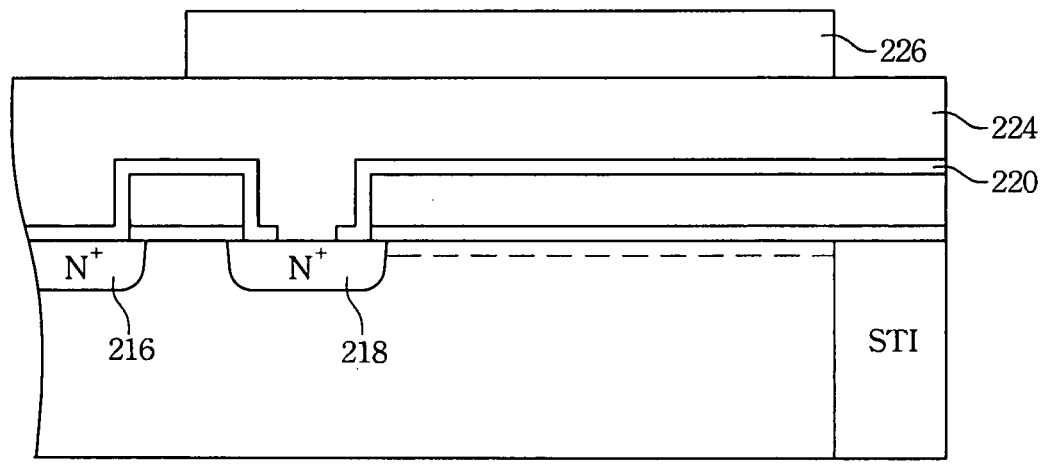
FIGS. 8A and 8B are cross section views of a DRAM cell at a seventh step of manufacturing according to one preferred embodiment of this invention.
Figure 8B:
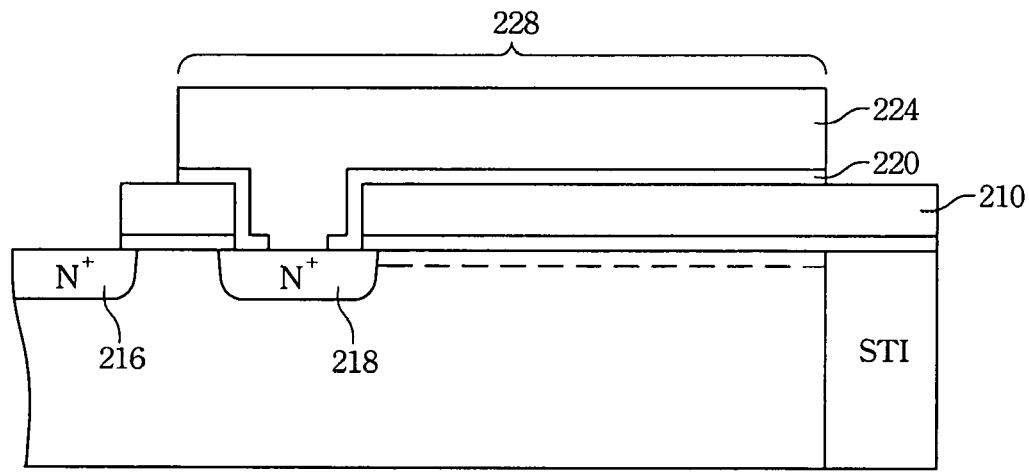

After the second conductive layer 224 is disposed, it is patterned to form a second capacitor structure, which the patterned second conductive layer 224 is used as a third capacitor electrode. Please refer to FIGS. 8A and 8B, a cross section view of a DRAM cell at a seventh step of manufacturing. In FIG. 8A, a third photo-resist layer 226 is applied to the top of the second conductive layer 224 and patterned by a third mask. Next, the second conductive layer 224 and the second dielectric layer 220 are etched to expose at least a portion of the gate structure 212, the source region 216, and also a portion of the first capacitor structure 214. Thus a second capacitor structure 228 is formed in this step, which is electrically connected to the drain region and shares the same storage node as the first capacitor structure 214. The second capacitor structure 228 introduces a second capacitance between the second conductive layer 224, namely, the third capacitor electrode and the first conductive layer 210, namely, the second capacitor electrode. The second capacitance is connected in parallel to the first capacitance; therefore the total capacitance of the DRAM cell 200 is the sum of the first and second capacitances. Since the second dielectric layer 220 may be of different thickness and material from the first dielectric layer 208, the second capacitance may be larger in value than the first capacitance. For example, if the first capacitance has a value of X from the permittivity of silicon oxide, the second capacitance may be made of silicon nitride with its permittivity introducing a capacitance value of 2x. The total capacitance of the DRAM cell 200 is then 3x, tripling the original capacitance in the conventional planar DRAM cell.

Figure 9:
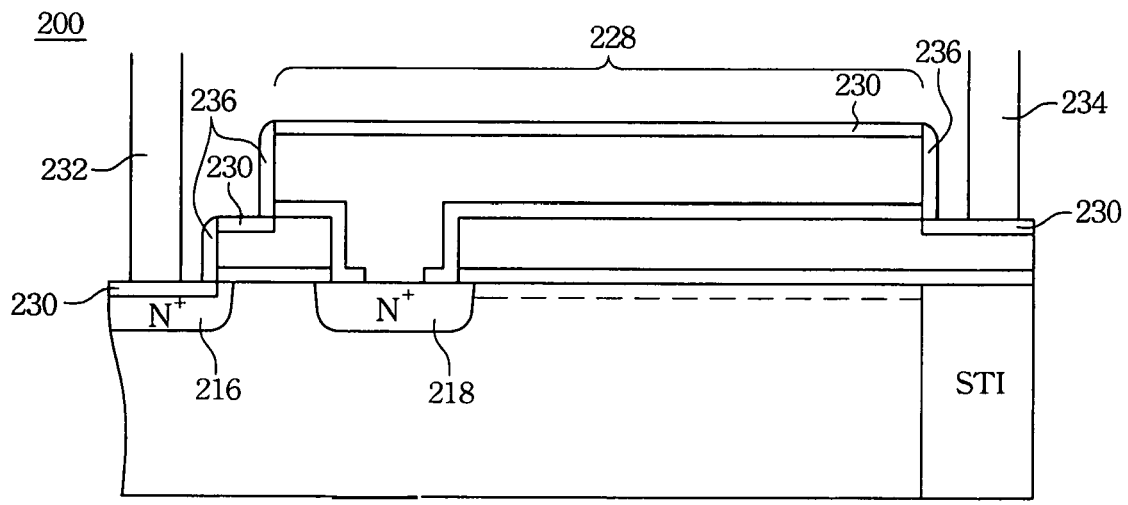
FIG. 9 is a cross section view of a DRAM cell at a last step of manufacturing according to one preferred embodiment of this invention.

Lastly, the final DRAM cell structure after the last manufacturing step according to the present invention is illustrated in FIG. 9. The final DRAM cell structure 200 has a salicide layer 230 overlaying the source region 216, the exposed portion of the gate structure 212, the second capacitor structure 228, and the exposed portion of the first capacitor structure 214. The salicide layer 230 is formed by overlaying a metal layer on the source region 216, exposed portion of the gate structure 212, the second capacitor structure 228 and the exposed portion of the first capacitor structure 214, and by removing an unreacted portion of the metal layer, such that salicide is formed by a metal and polysilicon reaction.

The salicide layer 230 allows the source region 216 to be electrically connected to the bit line 232 of the DRAM cell 200 via metal contacts. Also, the salicide layer 230 allows the gate structure to be electrically connected to the word line (not shown), and the second capacitor electrode to be connected to a plate node 234, where a plate voltage is applied to the plate node 234.

Therefore, the final DRAM cell structure manufactured by the above method according to the embodiment of the present invention includes a cell transistor and a cell capacitor. The cell capacitor includes a first, second and third dielectric layer, and a first, second and third capacitor electrode. The first dielectric layer is located on a first capacitor electrode. The second capacitor electrode is located on top of the first dielectric layer. The second dielectric layer is located on the second capacitor electrode. The third capacitor electrode is located on the second dielectric layer and is electrically connected with the drain. The third dielectric layer is located between the third capacitor electrode and the gate for isolating the gate from the third capacitor electrode.

Furthermore, the final structure may also include spacers 236 to isolate the second capacitor structure 228 from the gate structure 212 and the first capacitor structure 214. A contact etch stop layer (CESL) and an inter-level dielectric (ILD) layer (not shown) to complete the DRAM manufacturing process.

Overall, the DRAM cell provided by the embodiment of the present invention only contribute to about 5% of the total baseline process. This is because the embodiment of the present invention uses the current DRAM process while adding an additional second capacitor structure, which contributes to a very minimal overhead thus making the integration simple and low in cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dynamic random access memory (DRAM) cell, comprising:
   a cell transistor located on a substrate, the cell transistor comprising a source, a drain and a gate structure; and
   a cell capacitor comprising:
   a first capacitor electrode located on the substrate and electrically connecting with the drain;
   a first dielectric layer located on the first capacitor electrode;
   a second capacitor electrode located on the first dielectric layer;
   a second dielectric layer located on the second capacitor electrode;
   a third capacitor electrode located on the second dielectric layer, electrically connecting with the drain and isolated by the second dielectric from the second capacitor electrode and the first dielectric layer, wherein the third capacitor electrode overlaps a portion of the gate structure; and
   a third dielectric layer located between the third capacitor electrode and the gate for isolating the gate from the third capacitor electrode.

2. The DRAM cell of claim 1, further comprising a salicide layer disposed on both the source and the another portion of the gate structure, wherein the other portion of the gate structure does not overlap with the third capacitor electrode.

3. The DRAM cell of claim 1, wherein the first and second dielectric layers are silicon oxide layers, silicon nitride layers, aluminum oxide layers, or zirconium oxide layers.

4. The DRAM cell of claim 1, further comprising a salicide layer on an exposed portion of the second capacitor electrode for electrically connecting the cell capacitor to a plate node.

5. The DRAM cell of claim 1, wherein the first capacitor electrode is an inversion charge region on the substrate.

6. The DRAM cell of claim 1, wherein the second and third capacitor electrodes are made of polysilicon.

7. The DRAM cell of claim 1, further comprising:
   an isolation structure formed beside first capacitor electrode.

8. The DRAM cell of claim 7, wherein the isolation structure is shallow trench isolation (STI) structure.

9. The DRAM cell of claim 1, wherein a portion of the second dielectric layer and the third capacitor electrode are in contact with the drain.

10. The DRAM cell of claim 1, wherein the third capacitor electrode is made of polysilicon.

11. The DRAM cell of claim 1, further comprising:
    spacers formed beside the gate structure.

12. A dynamic random access memory (DRAM) cell, comprising:
    a cell transistor located on a substrate, the cell transistor comprising a source, a drain and a gate structure; and
    a cell capacitor comprising:
    a first capacitor electrode located on the substrate and electrically connecting with the drain;
    a first dielectric layer located on the first capacitor electrode;
    a second capacitor electrode located on the first dielectric layer;
    a second dielectric layer located on the second capacitor electrode;
    a third capacitor electrode located on the second dielectric layer, electrically connecting with the drain and isolated by the second dielectric from the second capacitor electrode and the first dielectric layer, wherein the third capacitor electrode overlaps a portion of the gate structure;
    a third dielectric layer located between the third capacitor electrode and the gate for isolating the gate from the third capacitor electrode; and
    a salicide layer overlaid on the source and another portion of the gate structure, wherein the other portion of the gate structure does not overlap with the third capacitor electrode.

13. The DRAM cell of claim 12, wherein the salicide layer is formed by a metal and polysilicon reaction.

14. The DRAM cell of claim 12, wherein the salicide layer allows the source to be electrically connected to a bit line.

15. The DRAM cell of claim 12, wherein the salicide layer allows the gate structure to be electrically connected to a word line.

16. A dynamic random access memory (DRAM) cell, comprising:
    a cell transistor located on a substrate, the cell transistor comprising a source, a drain and a gate structure; and
    a cell capacitor comprising:
    a first capacitor electrode located on the substrate and electrically connecting with the drain;
    a first dielectric layer located on the first capacitor electrode;
    a second capacitor electrode located on the first dielectric layer;
    a second dielectric layer located on the second capacitor electrode;
    a third capacitor electrode located on the second dielectric layer, electrically connecting with the drain and isolated by the second dielectric from the second capacitor electrode, wherein the third capacitor electrode overlaps a portion of the gate structure;
    a third dielectric layer located between the third capacitor electrode and the gate for isolating the gate from the third capacitor electrode; and
    a salicide layer formed by a metal and polysilicon reaction to overlay on the source and another portion of the gate structure, wherein the other portion of the gate structure does not overlay with the third capacitor electrode.

17. The DRAM cell of claim 16, further comprising:
    spacers formed beside the gate structure.

* * * * *